United States Patent
Holmes et al.

[19]

[11] Patent Number: 5,905,410
[45] Date of Patent: May 18, 1999

[54] LOCK/UNLOCK INDICATOR FOR PLL CIRCUITS

[75] Inventors: Glenn Edward Holmes, Wappingers Falls; Timothy Gerard McNamara, Fishkill; Paul David Muench, Poughkeepsie, all of N.Y.

[73] Assignee: International Business Machines Corporation, Armonk, N.Y.

[21] Appl. No.: 09/012,167

[22] Filed: Jan. 22, 1998

[51] Int. Cl.⁶ .................................................. H03L 7/095
[52] U.S. Cl. .............................. 331/1 A; 331/11; 331/25; 331/DIG. 2; 327/159
[58] Field of Search .................................. 331/1 A, 4, 11, 331/14, 16, 17, 25, DIG. 2; 327/156–159

[56] References Cited

U.S. PATENT DOCUMENTS

| | | | |
|---|---|---|---|
| 4,617,520 | 10/1986 | Levine | 328/133 |
| 5,680,076 | 10/1997 | Kelkar et al. | 331/25 |
| 5,734,273 | 3/1998 | Mudd | 327/36 |

*Primary Examiner*—David Mis
*Attorney, Agent, or Firm*—Lynn L. Augspurger

[57] ABSTRACT

A lock circuit for indicating a locked/unlocked condition of phased lock loops circuits, which uses a reference clock signal input to a good-cycle counter and to a bad-cycle counter to signal a set/reset latch to output a signal indicating whether or not the phase of the output signal and input clock are in phase. Phase detector inputs are XOR gated to produce a pulse when the phase locked output clock is in a bad cycle indicated by the phase locked output clock not being in-phase with its input clock. Pulses on the XOR gate output on a bad cycle feed a single cycle counter reset circuit. The single cycle counter reset circuit on every cycle resets one of the bad and good counters based on its detection of a bad cycle pulse from the XOR gate. The good-cycle counter's output is to the SET input of the set/reset latch, and the bad-cycle counter's output is to the RESET input of the set/reset latch. We enable specific cycling of both the good and bad counters.

4 Claims, 3 Drawing Sheets

LOCK/UNLOCK INDICATOR FOR PLL CIRCUITS

FIELD OF THE INVENTION

This invention is related to phase locked loop (PLL) control of clocks, and in particular to a method for indicating locking and unlocking of PLL circuits which detects when the output clock is in phase with the input clock as may be used in computers and communication devices.

BACKGROUND OF THE INVENTION

A PLL (Phase Locked Loop) produces an output clock which is in phase with the input clock and whose frequency is greater than or equal to the input frequency. The lock circuit in the PLL detects when the output clock is in phase with the input clock and sets its lock bit accordingly ('1' when locked). The existing lock circuit used for the purpose as illustrated in FIG. 1 provides a specific way to set the lock bit, so the designer knows the exact condition which must be satisfied before the lock bit turns on. The problem with the existing circuit is the process of unsetting the lock bit which is very unpredictable. As a result, when the circuit unlocks, the designer cannot identify a specific condition which must have existed for it to do so, and this persisting problem is addressed by our invention.

SUMMARY OF THE INVENTION

Our invention provides a circuit which is well defined and predictable. It comprises a lock circuit for indicating a locked/unlocked condition of phase lock loops circuits, which uses a reference clock signal input to a good-cycle counter and to a bad-cycle counter to signal a set/reset latch to output a signal indicating whether or not the phase of the output signal and input clock are in phase.

A phase detector decrement and an increment inputs are combined with an XOR gate to produce a pulse when the output clock is in a bad cycle indicated by the output clock not being in-phase with its input clock. Pulses on the XOR gate output in a bad cycle feed a resetable latch. The latch feeds another latch which on every cycle resets one of the bad or good counters based on its detection of a bad cycle pulse from the XOR gate. The good-cycle counter's output is connected to the SET input of a set/reset latch, and the bad-cycle counter's output is connected to the RESET input of a set/reset latch. We enable specific cycling of both the good and bad counters.

1. Our circuit can easily be changed to allow a different number of "good" and "bad" cycle counts to indicate lock and unlock conditions.

2. Since our circuit now provides an unlock indication that is very predictable, we are able to use this signal to aid in the debugging of any hardware problems associated with a PLL in the system. This signal can now be monitored and logged with all other error checkers in the system to help isolate and diagnose errors during system bring-up.

These and other improvements are set forth in the following detailed description. For a better understanding of the invention with advantages and features, refer to the description and to the drawings.

(Note: For convenience of illustration, figures may be separated in parts and as a convention we place the top of the figure as the first sheet, with subsequent sheets proceeding down and across when viewing the figure, in the event that multiple sheets are used.)

DETAILED DESCRIPTION OF THE INVENTION

Figure 1:
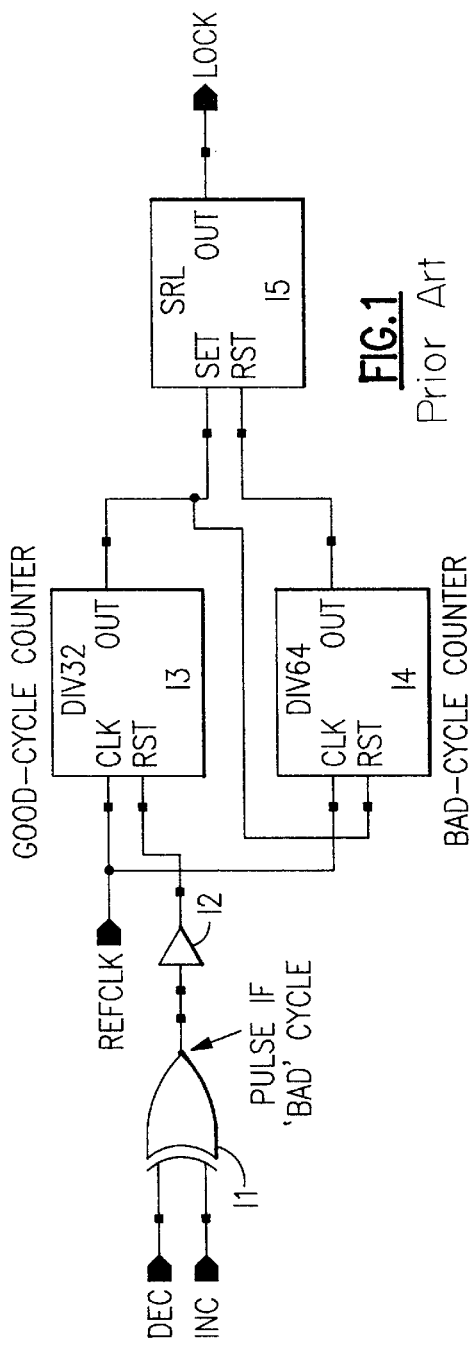
FIG. 1 illustrates the existing PRIOR ART lock circuit.

Before considering our preferred embodiments in detail, it may be worthwhile to illustrate, by way of example, the problems which we have described. The existing lock circuit is shown in FIG. 1. The initialization circuitry is not show for clarity, and will initialize the existing lock circuit's good-cycle counter 13, bad-cycle counter 14 and the set/reset latch 15 to '0'. The reference clock (REFCLK) input to the lock circuit is supplied to the chip. The decrement (DEC) and increment (INC) inputs are from the phase detector. These inputs are combined with an XOR gate (11 in the figure) to produce a pulse when the PLL's output clock is not in-phase with its input clock (a bad cycle). A bad-cycle pulse will reset the good-cycle counter 13 and thus start the counting of good cycles over. The amplifier 12 is used to shape the pulse which resets the good-cycle counter 13 and is tuned to define the desired transition between a good and bad cycle (e.g. if the input clock and the output clock are out-of-phase by <450 ps, then the cycle is good . . . if >450 ps, then cycle is bad).

Figure 2:
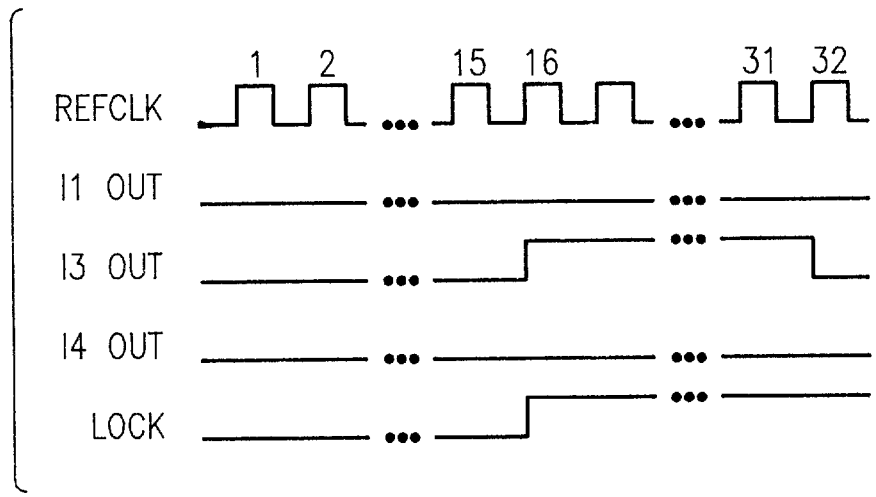
FIG. 2 shows the PRIOR ART lock circuit lock waveform.

To set the LOCK output, the good-cycle counter 13 must count to 16 (note: 13's output is bit-5 of a binary counter) without being reset by a bad-cycle pulse from 11. So the lock circuit must detect 16 consecutive good cycles for its LOCK bit to turn on. This is the specific algorithm mentioned earlier. The waveforms to achieve lock are shown in FIG. 2. The cycles shown here are all good and therefore 11's output stays low. After 16 good cycles, the good-cycle counter's output goes high, setting the lock bit and resetting the bad-cycle counter 14. To stay locked, the bad-cycle counter must never be allowed to count to 32 (note: 14's output is bit-6 of a binary counter). In an environment of continuously good cycles, the good-cycle counter will only let the bad-cycle counter count to 16 before being reset. Thus the existing lock circuit waveforms can be shown as in FIG. 2.

Figure 3:
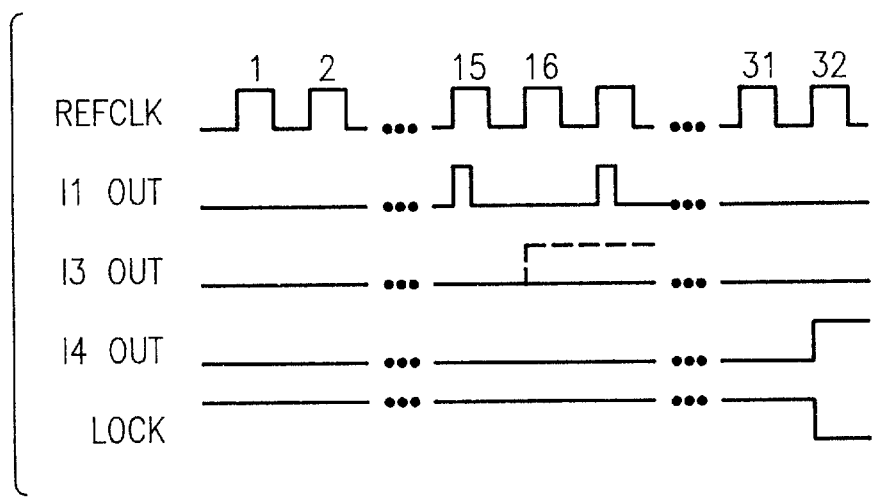
FIG. 3 shows the PRIOR ART lock circuit unlock waveform.

Unsetting the LOCK output once it has been set is accomplished with a much less specific algorithm. The reset input to the set/reset latch 15 needs to go high which means the bad-cycle counter must count to 32. This can happen with as few as 2 bad-cycle pulses from 11 or as many as 16 bad-cycle pulses. To understand this, refer to the waveforms shown in FIG. 3. The bad-cycle pulses must merely be timed to prevent the good-cycle counter 13 from going high and resetting the bad-cycle counter 14. In FIG. 3, we have done this with one bad-cycle pulse at the 15th reference cycle—a cycle before 13 was about to reset 14. We need one more bad-cycle pulse to prevent 13 from rising on the 31st reference cycle. Then 14 is allowed to count to 32 and its output will reset the LOCK output. So a minimum of 2 non-consecutive bad-cycle pulses is required to reset the LOCK output. On the other end of the spectrum, we could have 15 consecutive bad cycles and still not reset the LOCK output. If the bad cycles occur only at reference cycles 1–15, then 13 would reset 14 on the 31st cycle and the LOCK output would not be reset. So, the LOCK output could be reset with 2 bad cycles but may not get reset with 15. It all depends on the timing of the bad cycles relative to the position of the counters in 13 and 14. This is the unpredictable algorithm we mentioned earlier. These are illustrated as the existing unlock waveforms of FIG. 3.

Figure 4:
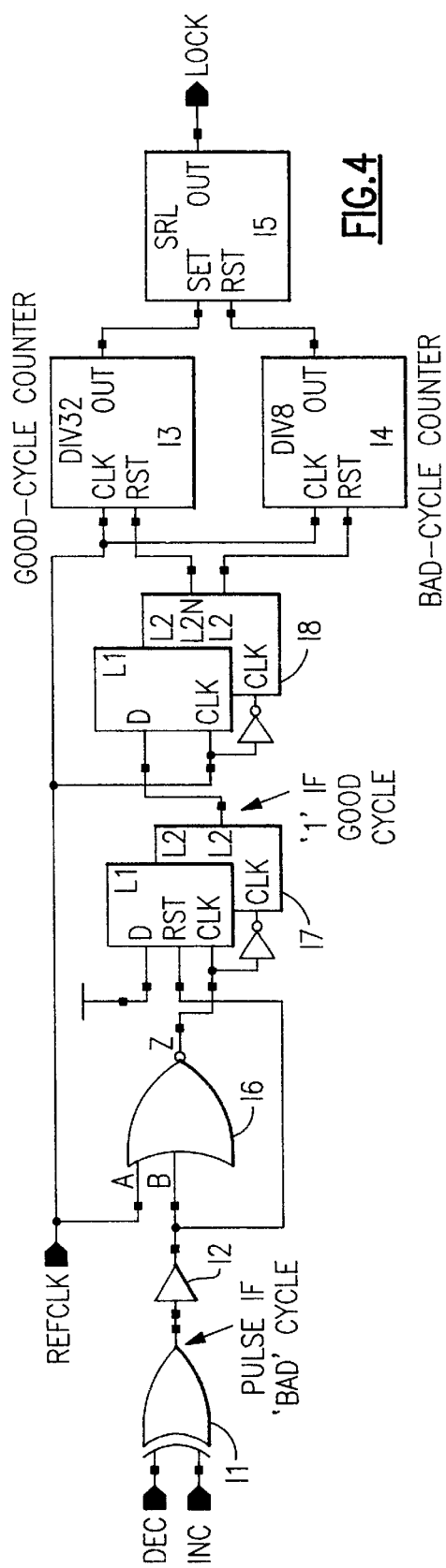
FIG. 4 shows our preferred embodiment and new locking circuit.
Figure 5:
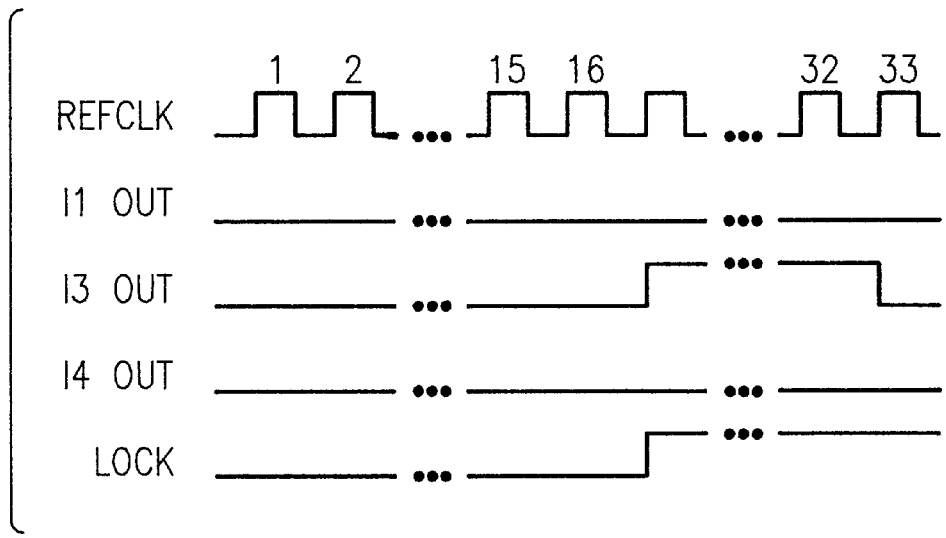
FIG. 5 shows our new lock circuit lock waveform.
Figure 6:
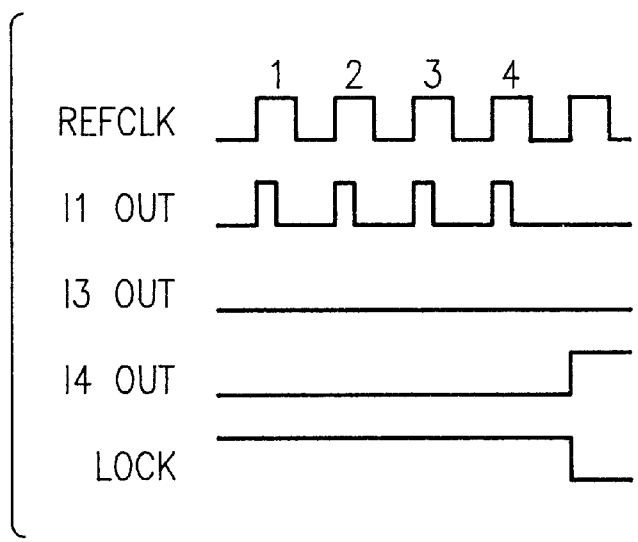
FIG. 6 shows our new lock circuit unlock waveform.

Turning now to our invention in greater detail, it will be seen from FIG. 4 which illustrates our preferred embodiment with additions to FIG. 1. Similarly to FIG. 2, FIG. 5 illustrates the lock waveforms of our new circuit, and FIG. 6 illustrates the new circuits unlock waveforms.

The new lock circuit is shown in FIG. 4. In this circuit we provide an XOR gate (11) coupled via amplifier (12) to provide a pulsed input to a pair of latches (17 and 18) which will result in the reset of either the good-cycle counter (13), or the bad-cycle counter (14), both of which are coupled with their outputs connected to the set and reset inputs (respectively) of a set/reset latch which provides the output signal of the lock circuit. The good-cycle counter remains a DIV32 counter outputting its bit-5 of a binary counter to the SET input of the set/reset latch (15). In our preferred embodiment, the bad-cycle counter has been changed from the DIV64 counter to a DIV8 such that the bad-cycle counter's output is now bit-3 of a binary counter. The choice of circuits to use for 13 and 14 will determine the number of good-cycles before lock and the number of bad-cycles before unlock respectively. The NOR circuit (16) is used to prevent contention between the reset and clock inputs to the reset latch (17).

The reference clock is provided to the lock circuit as before, but in addition the reference clock is used to clock the second latch so that its value is then clocked to the reset input of the counters on the mid-cycle when the reference clock goes low. This results in one, and only one, of the counters 13 and 14 being reset each cycle. This overcomes a root problem with the old lock circuit which caused the bad-cycle counter 14 to be reset by the output of the good-cycle counter 13. In the existing old lock circuit the relative positions of these two counters led to the variability in the unlock algorithm. But just as the new lock algorithm remains 16 consecutive good cycles as before (see FIG. 5) for locking, the unlock algorithm is now just as specific. This circuit requires 4 consecutive bad cycles to reset its LOCK output (see FIG. 6). There are critical timing relationships between the refclk and the output of 12 that are guaranteed by the operation of the phase detector. These timing relationships ensure that race conditions do not exist at the latches of FIG. 4.

While we have described our preferred embodiments of our invention, it will be understood that those skilled in the art, both now and in the future, may make various improvements and enhancements which fall within the scope of the claims which follow. These claims should be construed to maintain the proper protection for the invention first disclosed.

What is claimed is:

1. A lock circuit for indicating a locked/unlocked condition of phased lock loops circuits, comprising, a reference clock signal input, a good-cycle counter, a bad-cycle counter, and a set/reset latch for providing the output signal of the lock circuit, a phase detector input for the lock circuit being provided by a decrement input and an incremental input which are combined with an XOR gate to produce a pulse when the output clock is in a bad cycle indicated by the output clock not being in-phase with its input clock, pulses on the XOR gate output on a bad cycle feeding a pair of latches, said pair of latches resetting every cycle one of the bad or good counters based on its detection of a bad cycle pulse from said XOR gate, said good-cycle counter outputting to the SET input of the set/reset latch, and said bad-cycle counter's output is to the RESET input of said set/reset latch.

2. A lock circuit according to claim 1, wherein a reference clock is provided as an input to said good-cycle clock and bad-cycle clock as a clock input, and cyclically and specifically to the good-cycle counter and bad cycle counter reset input via said reset cycle circuit to reset these counters every cycle based on the detection of a bad-cycle pulse from said XOR gate in timed relationship between the reference clock and the output of said XOR gate that are determined by the phase detector input to the lock circuit.

3. A lock circuit according to claim 2, wherein lock algorithm remains 16 consecutive good cycles.

4. A lock circuit according to claim 3, wherein unlocking requires four bad cycles to reset its lock output.

* * * * *